(12) United States Patent
Yang et al.

(10) Patent No.: US 6,365,928 B1
(45) Date of Patent: Apr. 2, 2002

(54) SEMICONDUCTOR MEMORY STORAGE ELECTRODE AND METHOD OF MAKING

(75) Inventors: Hung-Mo Yang; Myoung-Seob Shim, both of Kyonggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/604,236

(22) Filed: Jun. 27, 2000

(30) Foreign Application Priority Data

Mar. 9, 2000 (KR) ........................................ 2000-11773
Jun. 15, 2000 (KR) ........................................ 2000-33039

(51) Int. Cl.$^7$ .......................................... H01L 27/108
(52) U.S. Cl. ........................ 257/296; 257/306; 438/241
(58) Field of Search ................................ 257/296, 306, 257/758, 326; 438/241, 256, 253, 396

(56) References Cited

U.S. PATENT DOCUMENTS 6,037,207 A * 3/2000 Asano et al. ............... 438/241
6,130,449 A * 10/2000 Matsuoka et al. .......... 257/296

* cited by examiner

Primary Examiner—Tuan H. Nguyen
(74) Attorney, Agent, or Firm—The Law Offices of Eugene M. Lee, PLLC

(57) ABSTRACT

A storage electrode structure and method of manufacturing thereof. Storage electrodes of dummy cells arranged in a word line direction and a bit line direction at the peripheral regions of a cell are formed such that every two or three dummy cells in a word line direction are formed in a single pattern. As a result, the loading effect produced in the peripheral regions of the cell region is reduced. The invention also reduces short-circuit bridging caused by collapsing storage electrode patterns in the dummy cells since the storage electrodes are not connected together. Accordingly, it is possible to minimize an increase in the loading capacitance of bit lines when an electrical short circuit occurs between a bit line and an associated buried contact.

5 Claims, 12 Drawing Sheets

SEMICONDUCTOR MEMORY STORAGE ELECTRODE AND METHOD OF MAKING

BACKGROUND OF THE INVENTION

1. Field of the Invention

The present invention relates to a method for manufacturing storage electrodes in a semiconductor memory device and a structure of those storage electrodes, and more particularly to a structure and method for manufacturing storage electrodes of dummy cells arranged at the peripheral portion of a cell region in a semiconductor memory device.

2. Description of the Prior Art

Semiconductor memory devices are mainly classified into products of a random access memory (RAM) type having a data volatility and products of a read only memory (ROM) type having no data volatility. In the case of a semiconductor memory device, which is of the RAM type and includes one access transistor and one capacitor, as in a dynamic RAM (DRAM), the data storing ability depends on the capacitance of the capacitor. For this reason, if such a semiconductor memory device has an insufficient capacitance, it may involve data errors. That is, data previously stored in the semiconductor memory device may be erroneously read out. In order to avoid such data errors in such a semiconductor memory device, it is necessary to periodically conduct a refresh operation adapted to store again the previously stored data after a predetermined period of time elapses. An increase in capacitance may improve refresh characteristics since the refresh operation is effected by the capacitance. However, this is impractical for recently developed high density semiconductor memory devices having reduced unit cell area. Such a reduction in the unit cell area decreases in the area where a capacitor is formed.

Generally, capacitance is proportional to the surface area where a storage electrode serving as a lower electrode and a plate electrode serving as an upper electrode are in spaced relation with each other while being inversely proportional to the distance between those two electrodes. In order to form a storage electrode having a surface area as large as possible within a limited area on the chip, a method has been proposed in which a capacitor under bit-line (CUB) structure formed with a capacitor under a bit line is also formed with a capacitor over the bit line using a capacitor over bit-line (COB) process, so that a stacked capacitor having a three-dimensional structure, such as a cylindrical, box, or pin type, is manufactured.

FIG. 1 is a schematic plan view illustrating a typical semiconductor device. As shown in FIG. 1, the semiconductor device includes a plurality of cell regions divided from one another by a peripheral circuit region. In FIG. 1, the reference character "A" denotes a boundary area between one cell region and the peripheral circuit region. In such boundary areas, diverse dummy patterns, such as dummy gates, dummy bit lines, and dummy capacitors, are typically formed. Although such dummy patterns are not associated with practical operations, they are provided to ensure the reliability of main cells and to achieve an improvement in resolution in a photolithography process. In recently developed semiconductor memory devices having storage electrodes with an increased height, thereby obtaining a higher capacitance with greater packing density, the increased height of those storage electrodes may cause a problem in that the storage electrode patterns of dummy cells arranged in the boundary area "A", between the cell region and peripheral circuit region, are smaller than a desired size due to a loading effect produced during formation thereof that may them to collapse. Where the storage electrode patterns collapse, a bridge phenomenon occurs, which results in a short circuit between adjacent storage electrodes. In order to solve this problem, a method has also been proposed in which the storage electrodes of dummy cells are connected together to form a single pattern.

FIG. 2 is a schematic enlarged plan view corresponding to the portion "A" of FIG. 1.

Referring to FIG. 2, a cell region typically includes main cells and dummy cells. The dummy cells are arranged at the peripheral portion of the cell region in order to ensure the reliability of the main cells. Respective storage electrodes of the dummy cells are connected together in a bit line direction (the horizontal direction in FIG. 2) and in a word line direction (the vertical direction in FIG. 2) so that they form a single large pattern. In detail, the storage electrodes in each of two dummy cell lines extending in the bit line direction are connected together, whereas the storage electrodes of one dummy cell line extending in the word line direction are connected together.

FIG. 3 is a layout diagram corresponding to FIG. 2.

Referring to FIG. 3, a semiconductor substrate (not shown), which is included in a semiconductor device defined with cell regions and a peripheral circuit region while having main cells and dummy cells at each cell region, is defined with an active region 11 at a desired portion thereof, and a field region (not shown) at the remaining portion thereof. A plurality of uniformly spaced word lines 14 are formed on the substrate in such a fashion that they extend vertically. A plurality of uniformly spaced bit lines 21 are also formed on the substrate in such a fashion that they extend in perpendicular to the word lines 14.

Landing pads 18 are formed at desired portions of active region 11, that is, common drain regions, between adjacent ones of word lines 14 so that they provide direct contacts DC adapted to electrically connect those common drain regions to associated ones of bit lines 21. At respective portions of active region 11 corresponding to source regions, landing pads 18 are also formed between adjacent ones of word lines 14 so that they provide buried contacts BC adapted to electrically connect those source regions to respective storage electrodes 24 of capacitors formed on the substrate. Storage electrodes 24 are provided for the main cells and dummy cells of the semiconductor device, respectively. Storage electrodes 24 of the dummy cells extending in two lines in the bit line direction while extending in one line in the word line direction are connected together in the form of a single pattern. On the other hand, storage electrodes 24 of the main cells are arranged in a matrix array and connected to buried contacts BC, respectively.

FIG. 4 is a cross-sectional view taken along a line B–B' of FIG. 3, that is, the bit line direction. FIG. 5 is a cross-sectional view taken along a line C–C' of FIG. 3, that is, the word line direction.

Referring to FIGS. 3 to 5, a semiconductor substrate 10, which has main cell regions and dummy cell regions, is first prepared and then defined with an active region 11 and a field region. A field oxide film 12 is then formed on the field region of semiconductor substrate 10. Access transistors, each of which includes a word line 14 and a spacer insulating film 16, are also formed on active region 11 of semiconductor substrate 10. A landing pad 18 is arranged on a desired portion of each access transistor, that is, a source region 17. Landing pad 18 is formed by etching a first interlayer insulating film 20 formed over semiconductor substrate 10, after the formation of the access transistors, in such a fashion that the associated source region 17 is exposed, and then filling an appropriate landing pad material on the exposed source region 17. Storage electrodes 24 for respective dummy cells are arranged in the form of a single pattern on respective landing pads 18 for the access transistors of those dummy cells. Storage electrodes 24 are formed by etching a second interlayer insulating film 22, formed over the structure obtained after the formation of landing pads 18, in such a fashion that the associated landing pads 18 are exposed, and then filling an appropriate storage electrode material on the exposed landing pads 18. Storage electrodes 24 are not separated from one another, but connected together in the form of a single pattern so that a plurality of access transistors share the single storage electrode pattern with one another. As shown in FIG. 5, bit lines 21 are arranged in second interlayer insulating film 22 in a buried fashion.

Storage electrodes 24, for respective main cells, are also formed in the form of a matrix array on respective buried contacts BC in desired portions of active region 11, that is, source regions 17.

Generally, as a semiconductor device has an increased packing density, its pattern for memory cells is gradually reduced in size. In this case, it is difficult to form a pattern having a uniform size throughout the entire portion thereof. In other words, during a photolithography process conducted to form a pattern for memory cells having a reduced size, a particular portion of the pattern may have a size smaller or larger than that of the remaining pattern portion. Such an effect is called a "loading effect". Due to the loading effect, the storage electrodes of dummy cells arranged at the peripheral portion of each cell region may collapse, thereby causing adjacent ones of those storage electrodes to be bridged. In most cases, such a loading effect is frequently generated at the peripheral portions of the cell regions. The formation of the storages electrodes 24 for respective dummy cells in the form of a single pattern results in a great decrease in the above mentioned loading effect. Accordingly, it is possible to eliminate the problem associated with the bridge between adjacent storage electrodes.

In this case, however, another problem may often occur in that the bit lines may be electrically short-circuited with buried contacts BC. Where an electrical short circuit occurs between a bit line and an associated buried contact, the bit line becomes connected with all the storage electrodes of respective dummy cells formed in a single pattern, so that its loading capacitance is excessively increased. This results soft errors occurring during a sensing operation for reading out data.

SUMMARY OF THE INVENTION

Therefore, a feature of the invention is to provide a method for manufacturing storage electrodes of a semiconductor memory device, which is capable of eliminating a bridge between adjacent storage electrodes due to a collapse of storage electrodes for dummy cells arranged at the peripheral portion of each cell region in the semiconductor memory device, and a structure of those storage electrodes.

Another feature of the invention is to provide a method for manufacturing storage electrodes of a semiconductor memory device, which is capable of minimizing the loading capacitance generated at respective bit lines of dummy cells, and a structure of those storage electrodes.

Another feature of the invention is to provide a storage electrode structure for a semiconductor memory device capable of preventing soft errors from being generated during a data sensing operation.

In accordance with one aspect, the present invention provides a method for manufacturing capacitor storage electrodes in a semiconductor memory device having main cells and dummy cells located in a cell region the method, comprising forming access transistors on a semiconductor substrate and thereafter depositing an interlayer insulating film, for planarization, over the semiconductor substrate; selectively etching the interlayer insulating film to form holes adapted to selectively expose impurity diffused regions of the access transistors, and thereafter depositing a conductive film, to serve as storage electrodes of capacitors, over the conductive film after forming the holes; and patterning the conductive film to form a plurality of separate storage electrodes so that at least two adjacent dummy cells share a storage electrode.

In accordance with another aspect, the present invention provides a semiconductor memory device having a main cell region and a dummy cell region at a cell region thereof comprising a semiconductor substrate; a plurality of uniformly spaced word lines arranged on the semiconductor substrate; a plurality of uniformly spaced bit lines arranged on the semiconductor substrate that extend in perpendicular to the word lines; direct contacts respectively arranged between adjacent ones of the word lines at active regions defined on the semiconductor substrate and adapted to connect the active regions to associated ones of the bit lines; buried contacts respectively arranged between adjacent ones of the word lines at the active regions and adapted to connect the active regions to associated ones of storage electrodes of capacitors; a plurality of separate dummy storage electrode patterns arranged in the dummy cell region and adapted to form dummy ones of the storage electrodes, each of the dummy storage electrode patterns serving to connect together at least two of the buried contacts arranged adjacent to each other in a word line direction in the dummy cell region; and a plurality of separate main storage electrode patterns arranged in the main cell region and adapted to form main ones of the storage electrodes, the main storage electrode patterns being arranged in a matrix array such that each is connected to an associated one of the buried contacts arranged in the main cell region.

The invention, though, is pointed out with particularity by the appended claims.

BRIEF DESCRIPTION OF THE DRAWINGS

The above features and other advantages of the present invention will become more apparent by describing in detail the preferred embodiment thereof with reference to the attached drawings, in which.

DESCRIPTION OF ILLUSTRATIVE EMBODIMENTS

Hereinafter, illustrative embodiments of the present invention will be described in detail, in conjunction with the annexed drawings.

Figure 1:
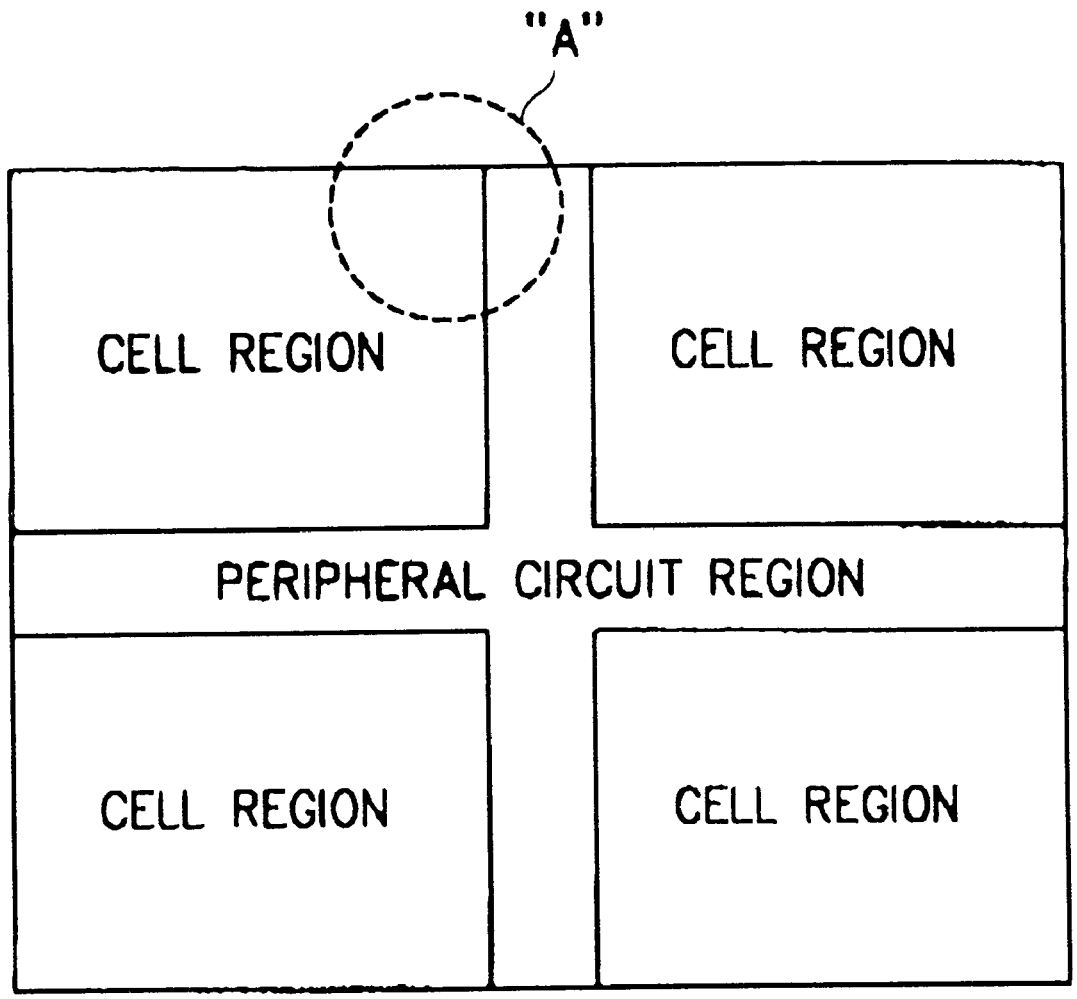
FIG. 1 is a schematic plan view illustrating a typical semiconductor device.
Figure 2:
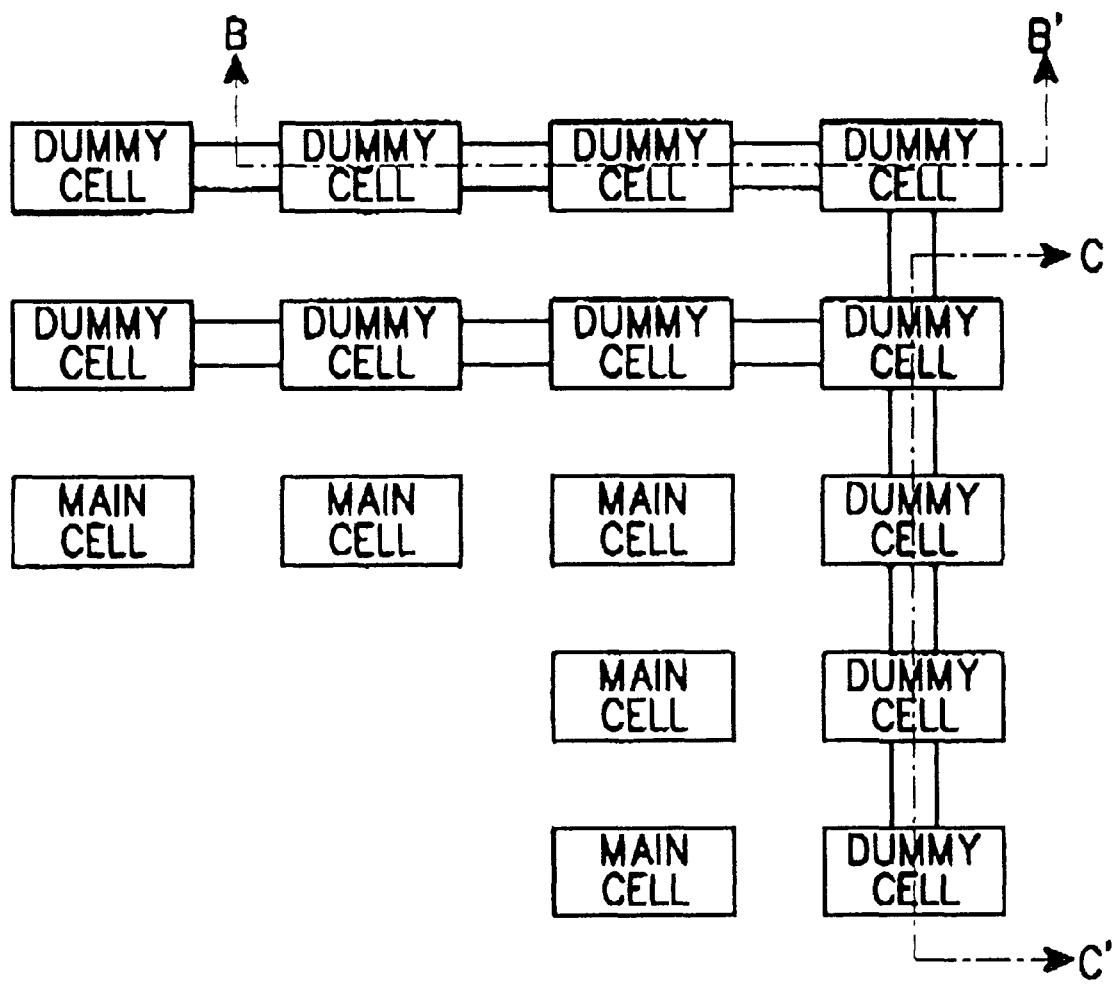
FIG. 2 is a schematic enlarged plan view corresponding to the portion "A" of FIG. 1.
Figure 3:
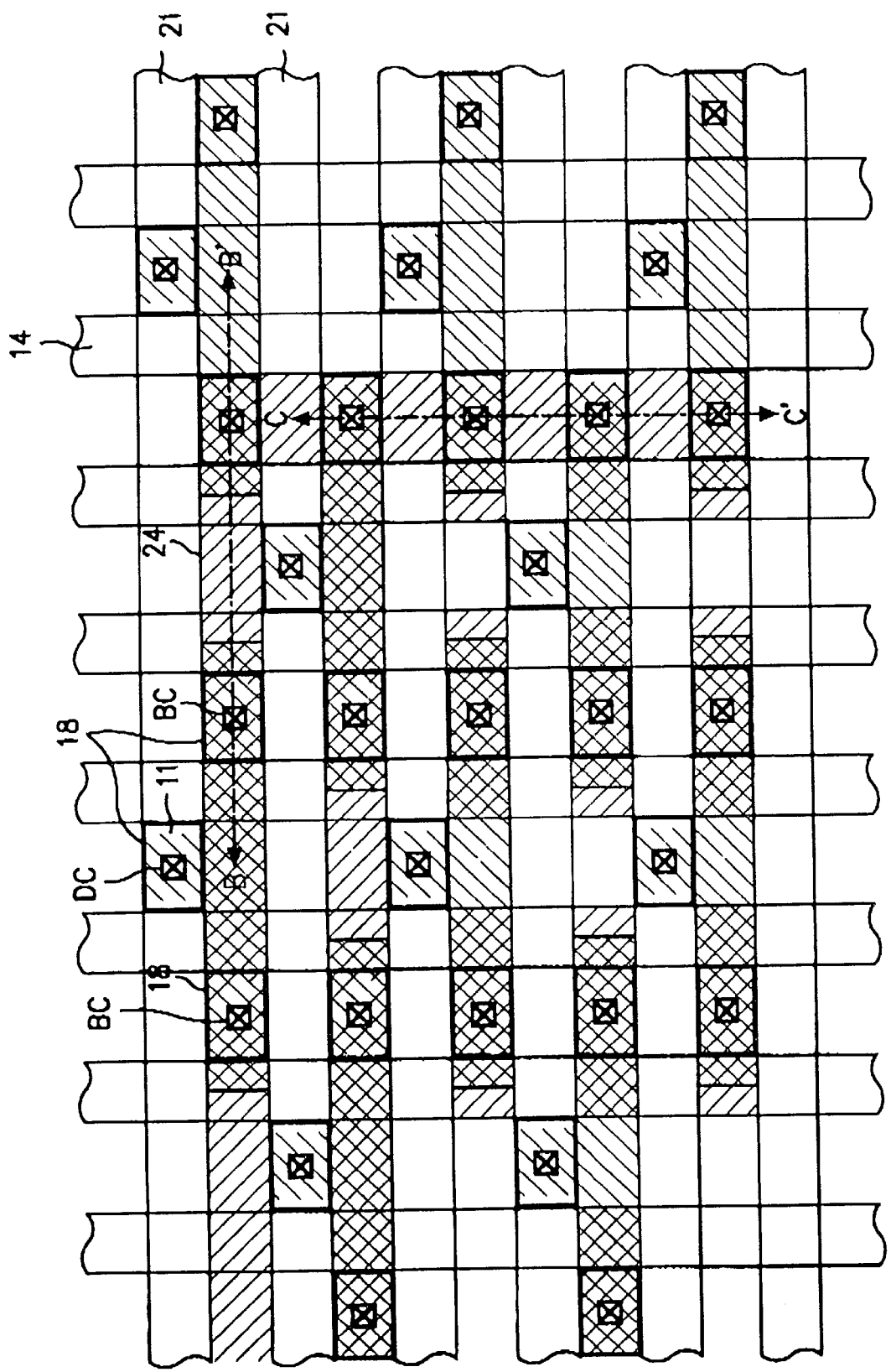
FIG. 3 is a layout diagram corresponding to FIG. 2.
Figure 4:
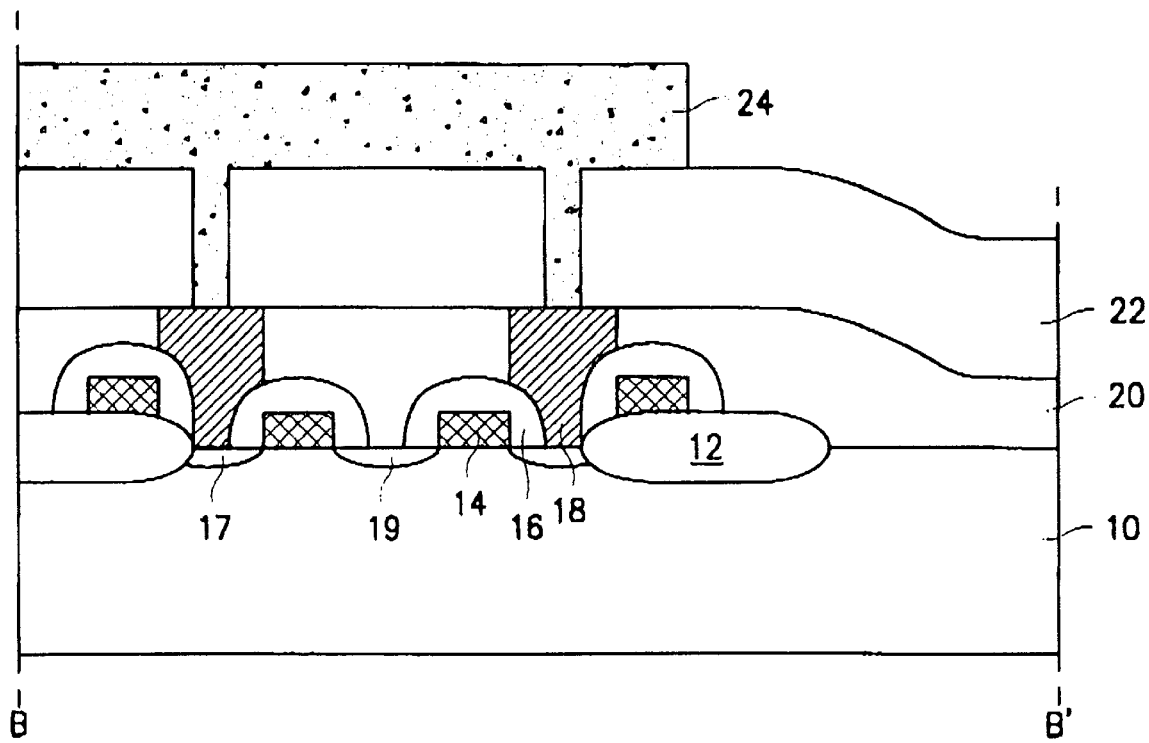
FIG. 4 is a cross-sectional view taken along the line B–B' of FIG. 3.
Figure 5:
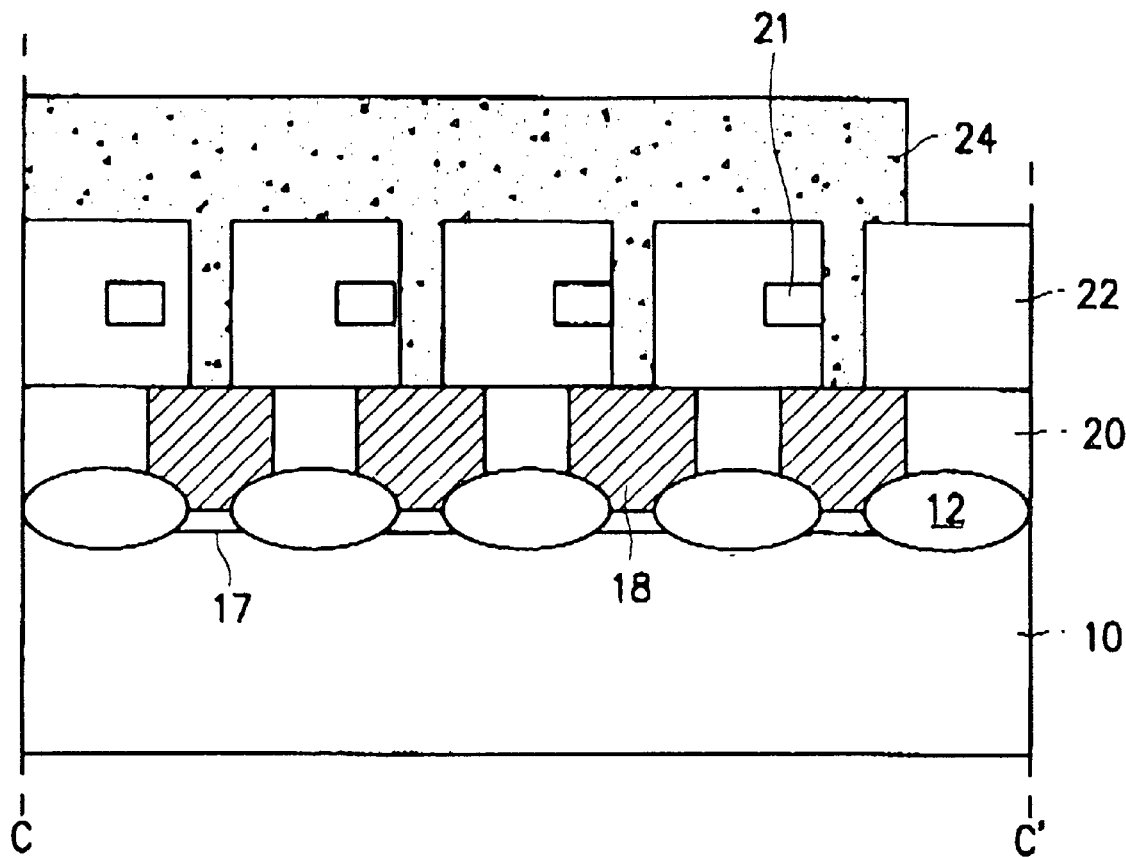
FIG. 5 is a cross-sectional view taken along the line C–C' of FIG. 3.
Figure 6:
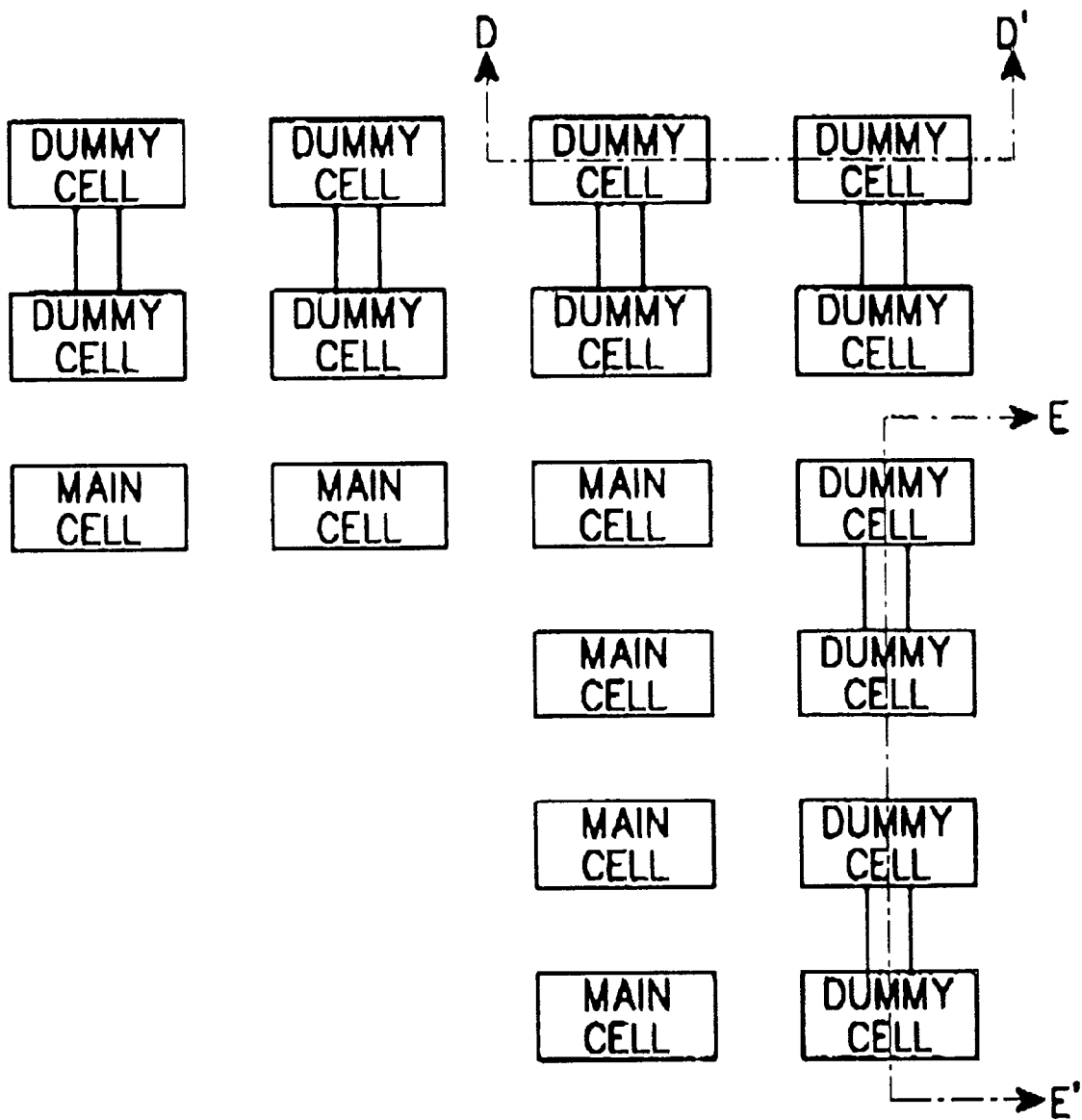
FIG. 6 is a schematic enlarged plan view corresponding to the portion "A" of FIG. 1 and illustrating a storage electrode structure for a semiconductor memory device according to a first embodiment of the present invention.

FIG. 6 is a enlarged plan schematic view corresponding to the portion "A" of FIG. 1 and illustrating a storage electrode structure for a semiconductor memory device according to a first embodiment of the present invention.

Referring to FIG. 6, a cell region typically includes main cells and dummy cells. The dummy cells are arranged at the peripheral portion of the cell region in order to ensure the reliability of the main cells. Respective storage electrodes of every two dummy cells arranged adjacent to each other in a word line direction (the vertical direction in FIG. 6) are connected to each other, so that they form a single pattern. By virtue of such a structure, in which the storage electrodes of every adjacent dummy cells are formed in a single pattern, it is possible to reduce the loading effect generated during a photolithography process, thereby eliminating the occurrence a collapsed storage electrodes of the dummy cells arranged at the peripheral portion of the cell region.

Figure 7:
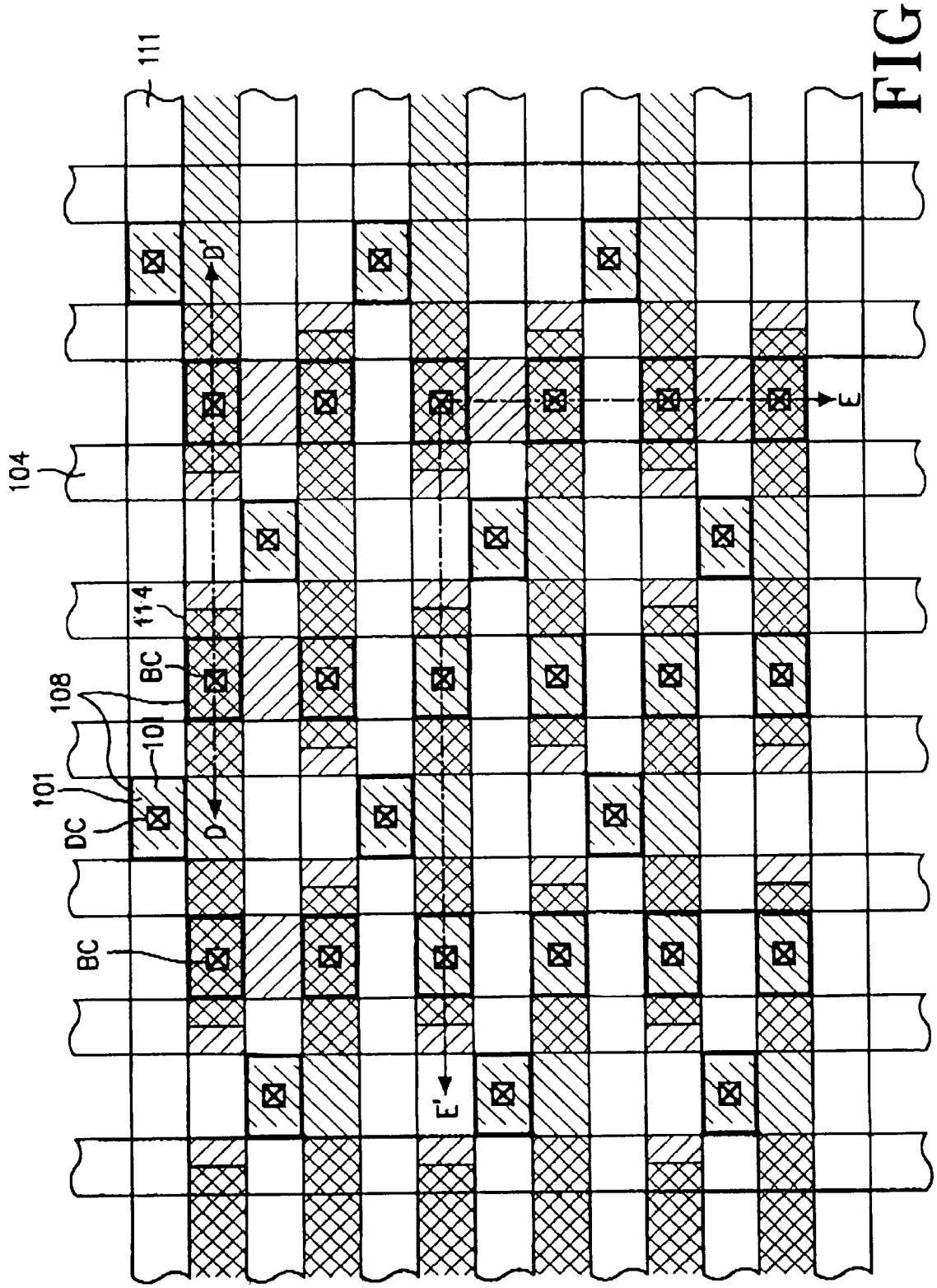
FIG. 7 is a layout diagram corresponding to FIG. 6.

FIG. 7 is a layout diagram corresponding to FIG. 6.

Referring to FIG. 7, a semiconductor substrate (not shown), which a semiconductor device defined with cell regions and a peripheral circuit region while having main cells and dummy cells at each cell region is formed on, is defined with an active region 101 at a desired portion thereof, and a field region at the remaining portion thereof. A plurality of uniformly spaced word lines 104 are formed on the semiconductor substrate in such a fashion that they extend vertically. A plurality of uniformly spaced bit lines 111 are also formed on the substrate in such a fashion that they extend in perpendicular to word lines 104.

Landing pads 108 are formed at desired portions of active region 101, that is, common drain regions, between adjacent ones of word lines 104 so that they provide direct contacts DC adapted to electrically connect those common drain regions to associated ones of bit lines 111. At respective portions of active region 101 corresponding to source regions, landing pads 108 are also formed between adjacent ones of word lines 104 so that they provide buried contacts BC adapted to electrically connect those source regions to respective storage electrodes 114 of capacitors formed on the semiconductor substrate. Storage electrodes 114 are provided for the main cells and dummy cells of the semiconductor device, respectively. Storage electrodes 114 of every two dummy cells arranged adjacent to each other in the word line direction are connected to each other, thereby forming a dumb-bell-shaped pattern. Although two adjacent dummy cells connected to each other form a dumb-bell shape, as shown in FIG. 7, they may have another shape in so far as they are connected together. On the other hand, storage electrodes 114 of the main cells are arranged in a matrix array and connected to buried contacts BC, respectively.

As the storage electrodes 114 of the dummy cells arranged at the peripheral portion of the cell region are formed in such a fashion that those of every two dummy cells arranged adjacent to each other in the word line direction form a single pattern together, it is possible to reduce the loading effect generated during the photolithography process.

Figure 8:
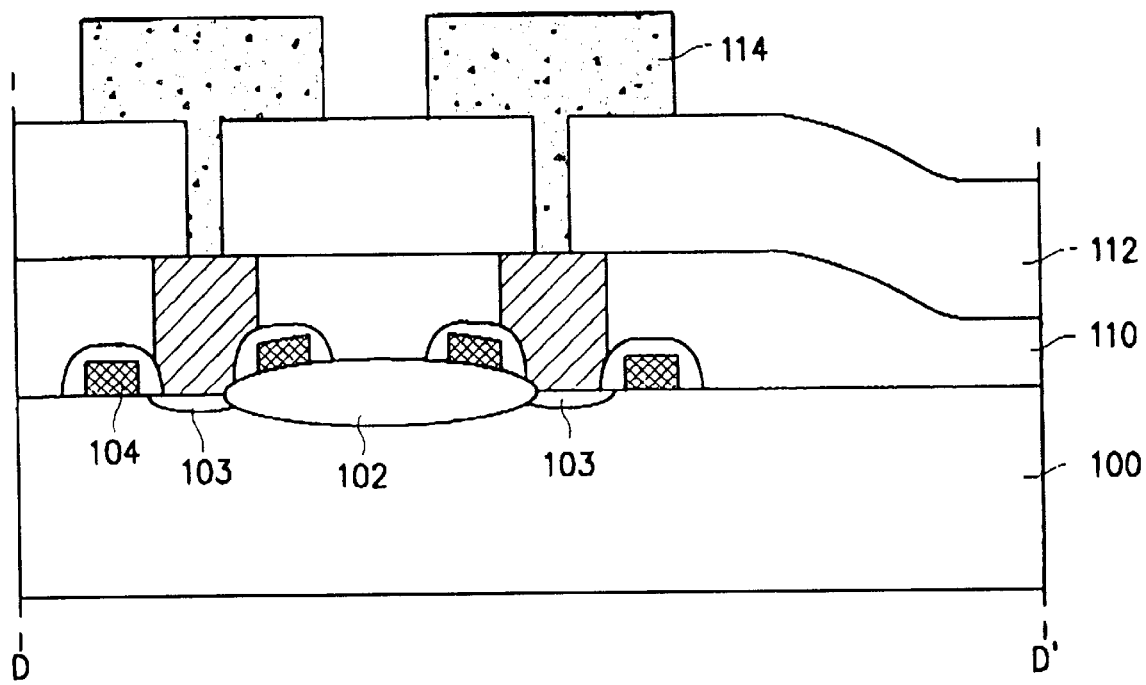
FIG. 8 is a cross-sectional view taken along the line D–D' of FIG. 7.
Figure 9:
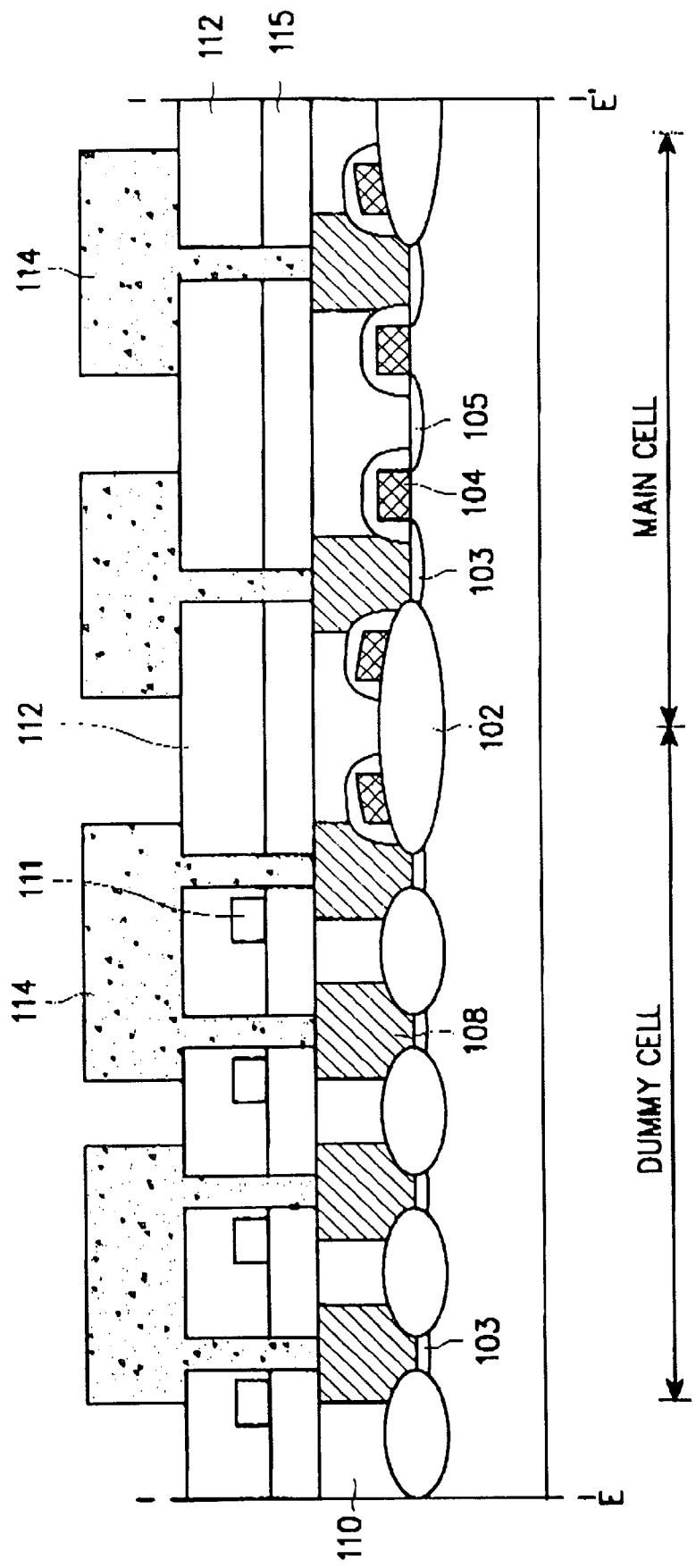
FIG. 9 is a cross-sectional view taken along the line E–E' of FIG. 7.

FIG. 8 is a cross-sectional view taken along the line D–D' of FIG. 7, that is, the bit line direction. FIG. 9 is a cross-sectional view taken along the line E–E' of FIG. 8, that is, and the bit line direction.

Referring to FIGS. 7 to 9, a semiconductor substrate 100, in which a semiconductor device having main cell regions and dummy cell regions and doped with p-type impurity ions is formed, is first prepared. Semiconductor substrate 100 is then subjected to a well-known element isolation process, for example, a local oxidation of silicon (LOCOS) process or an enhanced LOCOS process, to form a field oxide film 102 thereon. Thus, semiconductor substrate 100 is defined with an active region 101 and a field region. Thereafter, semiconductor substrate 100 is subjected to a dry or wet oxidation process at active region 101 thereof, so that a gate oxide film (not shown) is formed on active region 101. A conductive film made of, for example, polysilicon, is formed on the gate oxide film, thereby forming word lines 104. Subsequently, an insulating film, such as an oxide film or nitride film, is formed over the structure obtained after the formation of word lines 104 and then etched to form spacer insulating films 106, respectively covering word lines 104. Thus, gate regions are defined in semiconductor substrate 100. Using these gate regions as a self-aligned ion implantation mask, n-type impurity ions, such as phosphorous ions, are then implanted into semiconductor substrate 100, thereby forming impurity diffused regions serving as source and drain regions 103 and 105. Thus, access transistors are formed. Word lines 104 may be comprised of a laminated structure consisting of a doped polysilicon film and a metal silicide film in place of the single polysilicon film.

Over the entire upper surface of the resulting structure, a conductive film is deposited and then subjected to a photolithography process and an etching process, thereby forming landing pads 108, contacting respective impurity diffused regions of the access transistors. Subsequently, a first interlayer insulating film 110 is formed by depositing phosphorous silicon glass (PSG), boron phosphorous silicon glass (BPSG) or undoped silicon glass (USG) over the structure obtained after the formation of landing pads 108 in accordance with a chemical vapor deposition (CVD) method and planarizing the film (PSG, USG or BPSG) by etch-back process. Next, an insulating film (115) is deposited over the resulting structure, and then patterned to form direct contact holes through which those of landing pads 108 contacting respective drain regions 105 are exposed. Thereafter, a conductive film is deposited over the resulting structure and then patterned, thereby forming bit lines 111. Over the resulting structure, a second interlayer insulating film 112 is then formed in accordance with a CVD method in such a fashion that it covers bit lines 111. The second insulating film 112 is subjected to planarizing process, for example, etch back process or CMP (Chemical Mechanical Polishing) process, to have a planarized surface. Second interlayer insulating film 112 is subjected to a photolithography process and an etching process to form buried contact holes through which the impurity diffused regions of respective access transistors, in particular, landing pads 108 contacting respective source regions 103, are exposed. Subsequently, a conductive film made of, for example, polysilicon, is deposited over the resulting structure, and then patterned to form storage electrodes 114, serving as respective lower electrodes of capacitors. Although the lower electrodes are formed to have a box type structure, they may have a cylinder or pin type structure. Landing pad 108 may be dispensed with. In this case, the direct contact holes and buried contact holes are formed by directly exposing drain regions 105 and source regions 103.

Referring to FIG. 8, which is a cross-sectional view taken along the line D–D' of FIG. 7, that is, the bit line direction, it can be found that storage electrodes 114 of the access transistors in respective dummy cells are separated from one another. Referring to FIG. 9, which is a cross-sectional view taken along the line E–E' of FIG. 7, that is, the word line direction, however, it can be found that the access transistor of each main cell has one storage electrode pattern whereas the access transistors of every two adjacent dummy cells share one storage electrode pattern with each other.

Thus, in accordance with the first embodiment of the present invention, every two, arranged adjacent to each other in the word line directions, of the dummy cells arranged at the peripheral portion of the cell region share one storage electrode 114 with each other. As a result, the loading effect generated at the peripheral portion of the cell region is reduced. Accordingly, it is possible to eliminate the problem of a bridge phenomenon caused by a collapse of the storage electrode patterns in the dummy cells arranged at the peripheral portion of the cell region.

In conventional structures, there is a possibility of erroneous circuit operations caused by an electrical short circuit between the bit lines and the buried contacts because the storage electrodes are connected together in the form of a single pattern, not only in the dummy cells arranged adjacent to one another in the word line direction, but also in the dummy cells arranged adjacent to one another in the bit line direction. However, in the structure according to the first embodiment of the present invention, the storage electrodes are not connected together in the dummy cells arranged adjacent to one another in the bit line direction, but are connected together in the form of a single pattern in every two dummy cells arranged adjacent to each other in the word line direction. Accordingly, even though an electrical short circuit occurs between a bit line and an associated buried contact, it is possible to minimize an increase in the loading capacitance because the storage electrodes of the dummy cells are in a state separated from one another in the bit line direction. Thus, a great decrease in the soft error rate in a data sensing operation is achieved.

Figure 10:
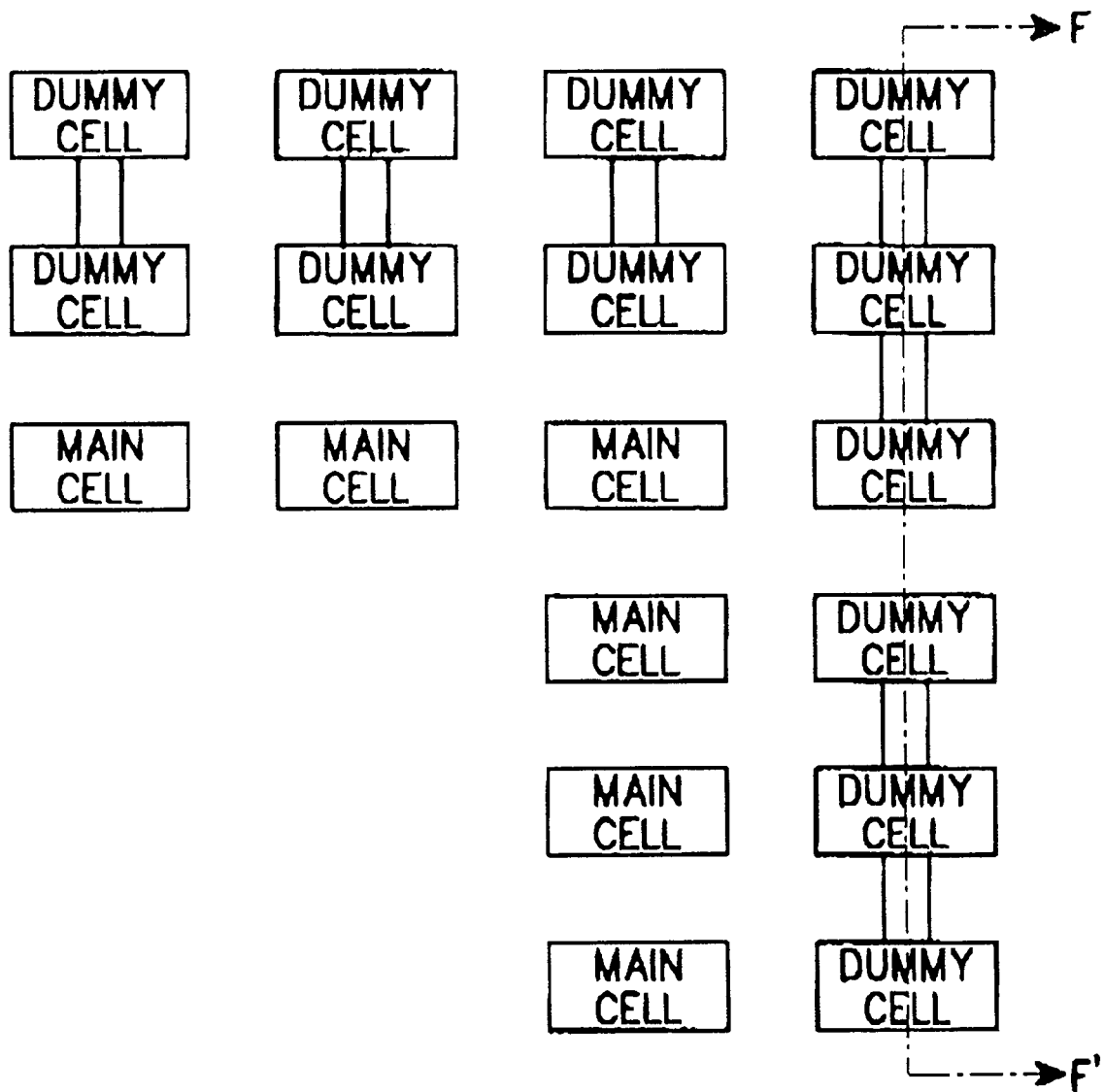
FIG. 10 is a schematic enlarged plan view corresponding to the portion "A" of FIG. 1 and illustrating a storage electrode structure for a semiconductor memory device according to a second embodiment of the present invention.

FIG. 10 is a schematic enlarged plan view corresponding to the portion "A" of FIG. 1 and illustrating a storage electrode structure for a semiconductor memory device according to a second embodiment of the present invention.

Referring to FIG. 10, it can be found that every two or three, arranged adjacent to each other in the word line direction (the vertical direction in FIG. 10), of dummy cells arranged at the peripheral portion of a cell region are connected together in the form of a single pattern. In detail, where there are two dummy cells aligned in the word line direction, they are connected to each other in the form of a single pattern. On the other hand, where there are at least three dummy cells aligned in the word line direction, every three thereof are connected together in the form of a single pattern.

In accordance with the second embodiment of the present invention, it is possible to further reduce the loading effect generated at the peripheral portion of the cell region in the photolithography process, as compared to the first embodiment, because the storage electrodes of every two or three dummy cells arranged adjacent to each other in the word line directions are formed in the form of a single pattern.

Figure 11:
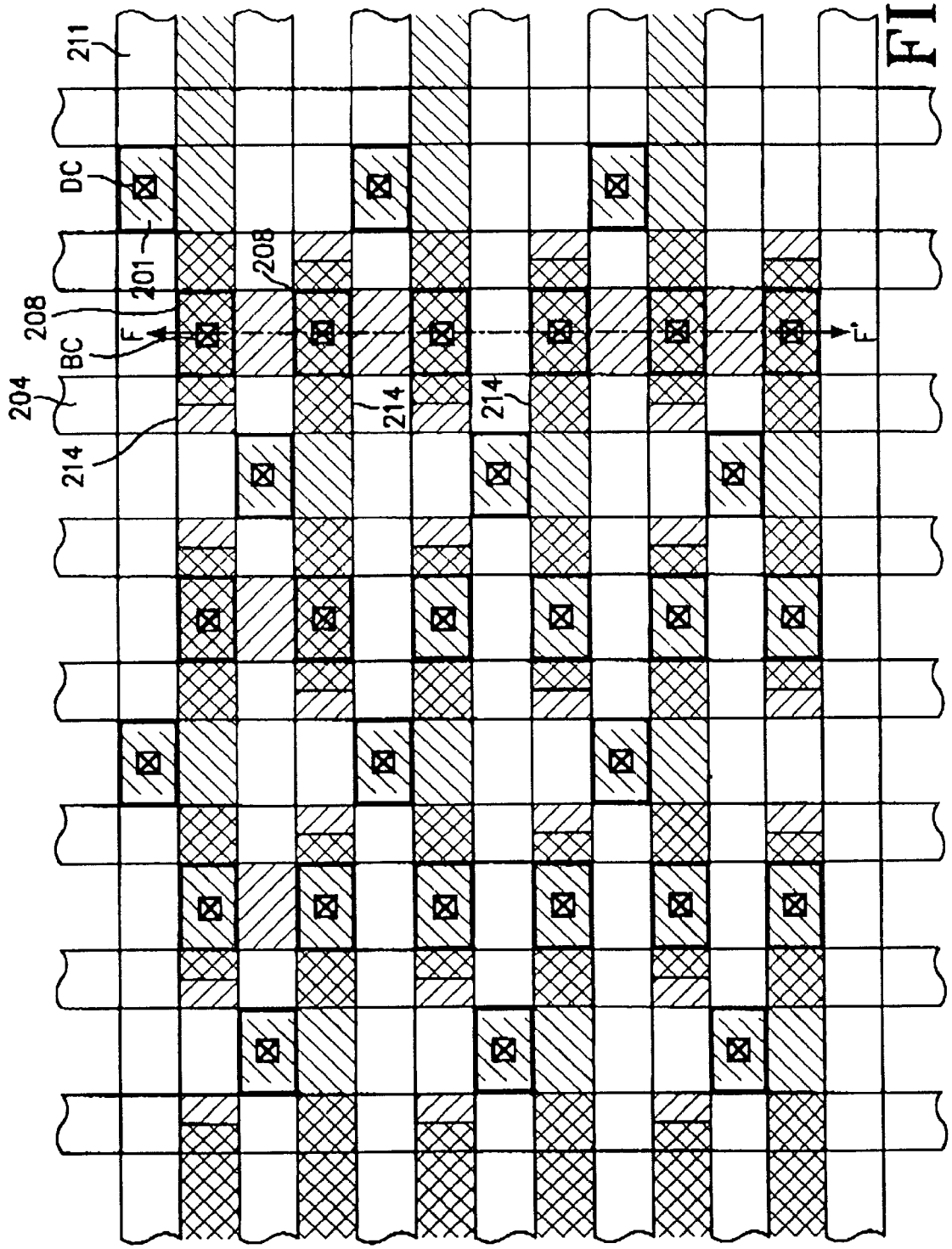
FIG. 11 is a layout diagram corresponding to FIG. 10.

FIG. 11 is a layout diagram corresponding to FIG. 10.

Referring to FIG. 11, a semiconductor substrate (not shown), in which a semiconductor device defined with cell regions and a peripheral circuit region while having main cells and dummy cells at each cell region is formed, is defined with an active region 201 at a desired portion thereof, and a field region at the remaining portion thereof. A plurality of uniformly spaced word lines 204 are formed on the semiconductor substrate in such a fashion that they extend vertically. A plurality of uniformly spaced bit lines 211 are also formed on the substrate in such a fashion that they extend in perpendicular to word lines 204. Landing pads 208 are formed at desired portions of active region 201, that is, common drain regions 205, so that they provide direct contacts DC adapted to electrically connect those common drain regions to associated ones of bit lines 211. At respective portions of active region 201 corresponding to source regions, landing pads 208 are also formed to provide buried contacts BC adapted to electrically connect those source regions to respective storage electrodes 214 of capacitors formed on the semiconductor substrate. Storage electrodes 214 are provided for the main cells and dummy cells of the semiconductor device, respectively. Storage electrodes 214 of every two or three dummy cells arranged adjacent to each other in the word line direction are connected to each other in the form of a single pattern.

As storage electrodes 214 of the dummy cells arranged at the peripheral portion of the cell region are formed in such a fashion that those of every two or three dummy cells arranged adjacent to each other in the word line direction form a single pattern together, it is possible to reduce the loading effect generated during the photolithography process.

Figure 12:
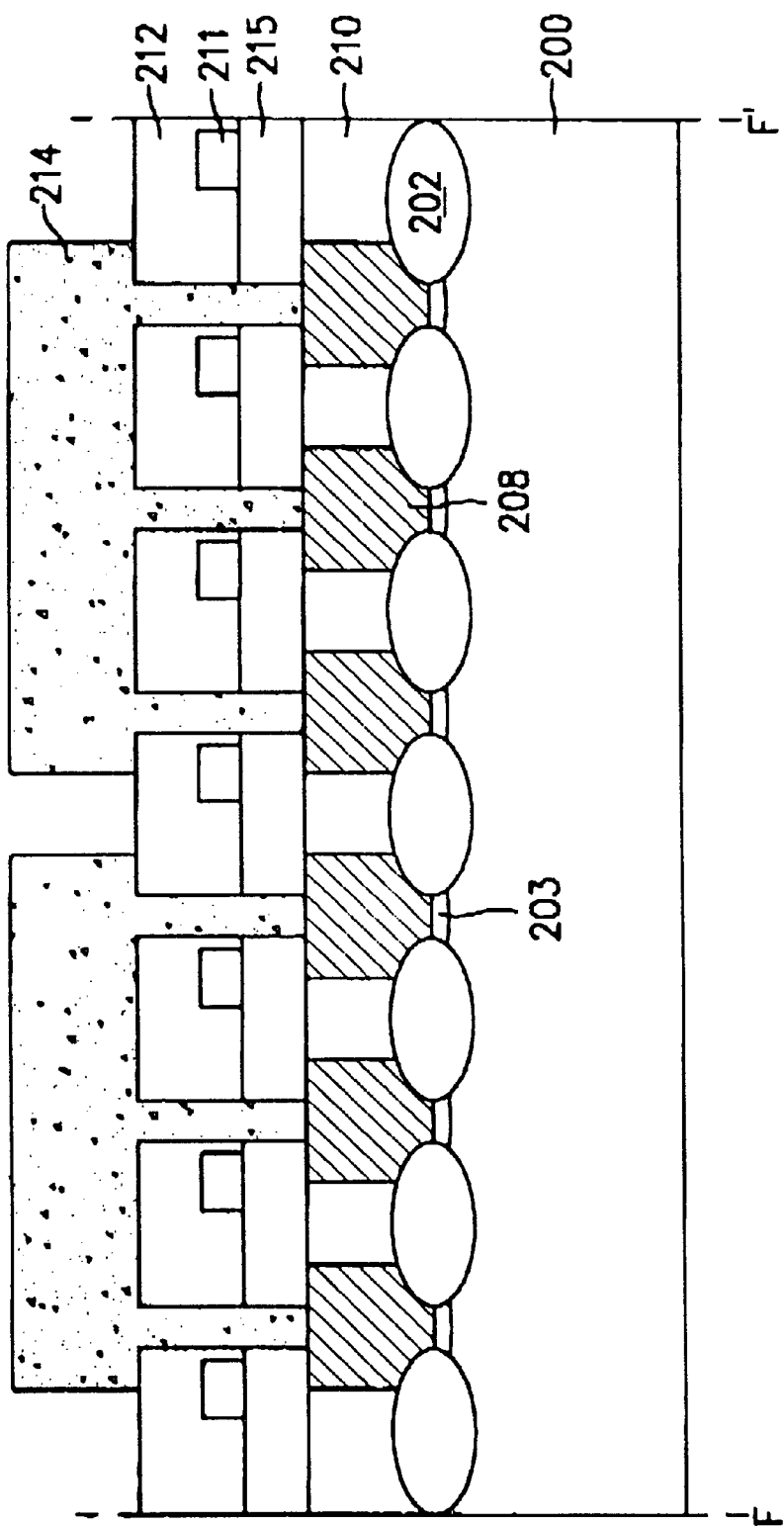
FIG. 12 is a cross-sectional view taken along the line F–F' of FIG. 11.

FIG. 12 is a cross-sectional view taken along the line F–F' of FIG. 11, that is, the word line direction.

Referring to FIG. 12, a semiconductor substrate 200 is prepared, and then formed with a field oxide film 202, source regions 203, landing pads 208, a first interlayer insulating film 210, and insulating layer 215, bit lines 211, and a second interlayer insulating film 212 covering bit lines 211 by use of the same processes as in the first embodiment. Thereafter, storage electrodes 214 are formed in such a fashion that every three thereof arranged adjacent to one another in the word line directions are formed in the form of a single pattern, so that every three access transistors arranged adjacent to one another share one storage electrode pattern with one another.

In accordance with the second embodiment of the present invention, it is possible to further reduce the loading effect generated at the peripheral portion of the cell region in the photolithography process, as compared to the first embodiment, because every two or three dummy cells arranged adjacent to each other in the word line directions share one storage electrode pattern with one another.

Similar to the structure according to the first embodiment, storage electrodes 214 are not connected together in the dummy cells arranged adjacent to one another in the bit line direction, but are connected together in the form of a single pattern in every two or three dummy cells arranged adjacent to each other in the word line direction. Accordingly, even though an electrical short circuit occurs between a bit line and an associated buried contact, it is possible to prevent an increase in the loading capacitance because the storage electrodes of the dummy cells are in a state separated from one another in the bit line direction, While the present invention has been particularly shown and described with reference to a particular embodiment thereof, it will be understood by those skilled in the art that various changes in form and detail may be effected therein without departing away from the scope of the invention as defined by the appended claims.

As apparent from the above description, in accordance with the present invention, storage electrodes of dummy cells arranged at the peripheral portion of a cell region are formed by patterning a conductive film for those storage electrodes in such a fashion that at least two dummy cells arranged adjacent to each other in a word line direction share one storage electrode pattern with each other. As a result, the loading effect generated at the peripheral portion of the cell region is reduced. Accordingly, it is possible to eliminate the problem of a bridge phenomenon caused by a collapse of the storage electrode patterns in the dummy cells arranged at the peripheral portion of the cell region.

Also, the storage electrodes are not connected together in the dummy cells arranged adjacent to one another in the bit line direction. Accordingly, it is possible to minimize an increase in the loading capacitance of bit lines generated when an electrical short circuit occurs between a bit line and an associated buried contact. Thus, a great decrease in the soft error rate in a data sensing operation is achieved.

What is claimed is:

1. A semiconductor memory device having a main cell region and a dummy cell region at a cell region thereof comprising:

a semiconductor substrate;

a plurality of uniformly spaced word lines arranged on the semiconductor substrate;

a plurality of uniformly spaced bit lines arranged on the semiconductor substrate that extend perpendicular to the word lines;

direct contacts respectively arranged between adjacent ones of the word lines at active regions defined on the semiconductor substrate and adapted to connect the active regions to associated ones of the bit lines;

buried contacts respectively arranged between adjacent ones of the word lines at the active regions and adapted to connect the active regions to associated ones of storage electrodes of capacitors;

a plurality of separate dummy storage electrode patterns arranged in the dummy cell region and adapted to form dummy ones of the storage electrodes, each of the dummy storage electrode patterns serving to connect together at least two of the buried contacts arranged adjacent to each other in a word line direction in the dummy cell region; and a plurality of separate main storage electrode patterns arranged in the main cell region and adapted to form main ones of the storage electrodes, the main storage electrode patterns being arranged in a matrix array such that each is connected to an associated one of the buried contacts arranged in the main cell region.

2. The semiconductor memory device in accordance with claim 1, wherein each of the dummy storage electrode patterns has a dumb-bell shape.

3. The semiconductor memory device in accordance with claim 1, wherein each of the dummy storage electrode patterns serves to connect two or three of the buried contacts arranged in the dummy cell regions.

4. The semiconductor memory device in accordance with claim 1, further comprising a plurality of first landing pads, each arranged at the active region and adapted to connect an associated one of the direct contacts to the active region.

5. The semiconductor memory device in accordance with claim 1, further comprising a plurality of second landing pads, each arranged at the active region and adapted to connect an associated one of the buried contacts to the active region.

* * * * *